(12) United States Patent  (10) Patent No.: US 8,957,320 B2
Furutani et al.  (45) Date of Patent: Feb. 17, 2015

(54) PRINTED WIRING BOARD

(75) Inventors: Toshiki Furutani, Ogaki (JP);
Yukinobu Mikado, Ogaki (JP);
Shunsuke Sakai, Ogaki (JP); Yusuke Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 102 days.

(21) Appl. No.: 13/558,892

(22) Filed: Jul. 26, 2012

(65) Prior Publication Data
US 2013/0192883 A1  Aug. 1, 2013

Related U.S. Application Data

(60) Provisional application No. 61/545,707, filed on Oct. 11, 2011.

(51) Int. Cl.
*H05K 1/16* (2006.01)
*H05K 1/18* (2006.01)
*H05K 1/02* (2006.01)
*H05K 3/46* (2006.01)

(52) U.S. Cl.
CPC .............. *H05K 1/162* (2013.01); *H05K 1/185* (2013.01); *H05K 1/0231* (2013.01); *H05K 3/4661* (2013.01)
USPC ............................ 174/260; 174/261; 174/262

(58) Field of Classification Search
CPC ..... H05K 1/162; H05K 1/185; H05K 1/0231; H05K 3/4661; H05K 1/183; H05K 1/182; H05K 1/18; H05K 1/16; H05K 1/0201; H05K 1/023; H05K 1/0243; H05K 1/181; H05K 3/4697

USPC .......... 174/250–268; 361/760–761, 792–795
See application file for complete search history.

(56) References Cited

U.S. PATENT DOCUMENTS

| 2007/0143993 | A1* | 6/2007 | Hsu ............................... 29/832 |
| 2008/0266822 | A1* | 10/2008 | Wu et al. .................... 361/761 |
| 2011/0069448 | A1* | 3/2011 | Weichslberger et al. ..... 361/688 |
| 2012/0018198 | A1 | 1/2012 | Furutani et al. |
| 2012/0032335 | A1 | 2/2012 | Kariya et al. |
| 2012/0080786 | A1 | 4/2012 | Furutani et al. |

FOREIGN PATENT DOCUMENTS

JP  2002-204045  7/2002

OTHER PUBLICATIONS

U.S. Appl. No. 13/537,145, filed Jun. 29, 2012, Furutani, et al.

* cited by examiner

*Primary Examiner* — Ishwarbhai B Patel
(74) *Attorney, Agent, or Firm* — Oblon, Spivak, McClelland, Maier & Neustadt, L.L.P.

(57) ABSTRACT

A printed wiring board includes a substrate having an accommodation section having multiple opening portions, multiple electronic components accommodated in the opening portions, respectively, a filler resin provided in the opening portions in the substrate such that the electronic components are secured in the opening portions in the substrate, a resin insulation layer formed over the substrate and the electronic components, a conductive layer formed on the resin insulation layer, and via conductors formed in the resin insulation layer and connecting the conductive layer and the electronic components. The opening portions are connected to each other.

19 Claims, 15 Drawing Sheets

(A)

(B)

(C)

(A)

(B)

FIG. 15     (A)
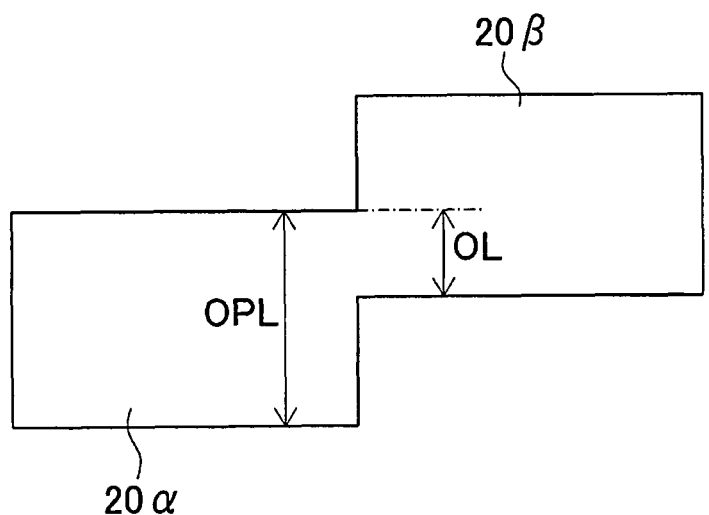
(B)
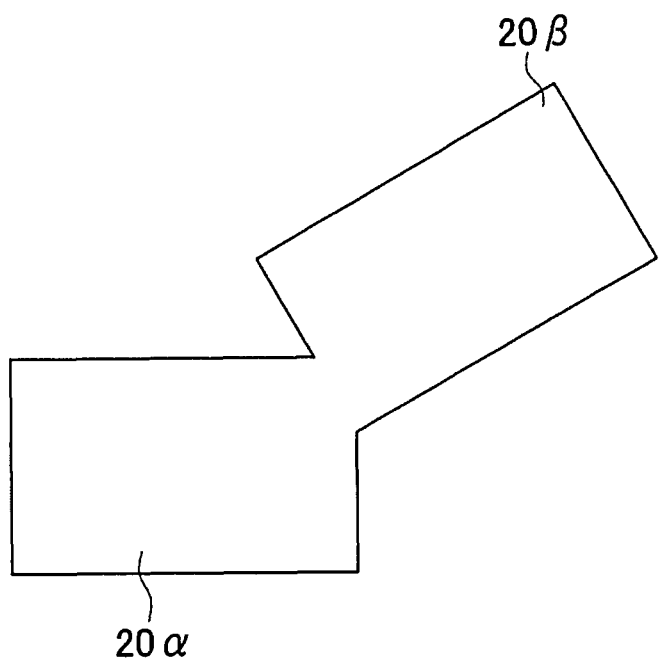

PRINTED WIRING BOARD

CROSS-REFERENCE TO RELATED APPLICATIONS

The present application is based on and claims the benefit of priority to U.S. application Ser. No. 61/545,707, filed Oct. 11, 2011, the entire contents of which are incorporated herein by reference.

BACKGROUND OF THE INVENTION

1. Field of the Invention

The present invention relates to a printed wiring board having a substrate with multiple opening portions to accommodate electronic components and a buildup layer formed on the substrate.

2. Discussion of the Background

Japanese Laid-Open Patent Publication No. 2002-204045 describes a method for manufacturing a printed wiring board with capacitors built into a penetrating hole. In Japanese Laid-Open Patent Publication No. 2002-204045, multiple capacitors are built into a penetrating hole, and the capacitors are secured in the penetrating hole with filler resin. The entire contents of this publication are incorporated herein by reference.

SUMMARY OF THE INVENTION

According to one aspect of the present invention, a printed wiring board includes a substrate having an accommodation section having multiple opening portions, multiple electronic components accommodated in the opening portions, respectively, a filler resin provided in the opening portions in the substrate such that the electronic components are secured in the opening portions in the substrate, a resin insulation layer formed over the substrate and the electronic components, a conductive layer formed on the resin insulation layer, and via conductors formed in the resin insulation layer and connecting the conductive layer and the electronic components. The opening portions are connected to each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 15(A)-(B) are magnified views showing opening portions.

DETAILED DESCRIPTION OF THE EMBODIMENTS

Figure 1:
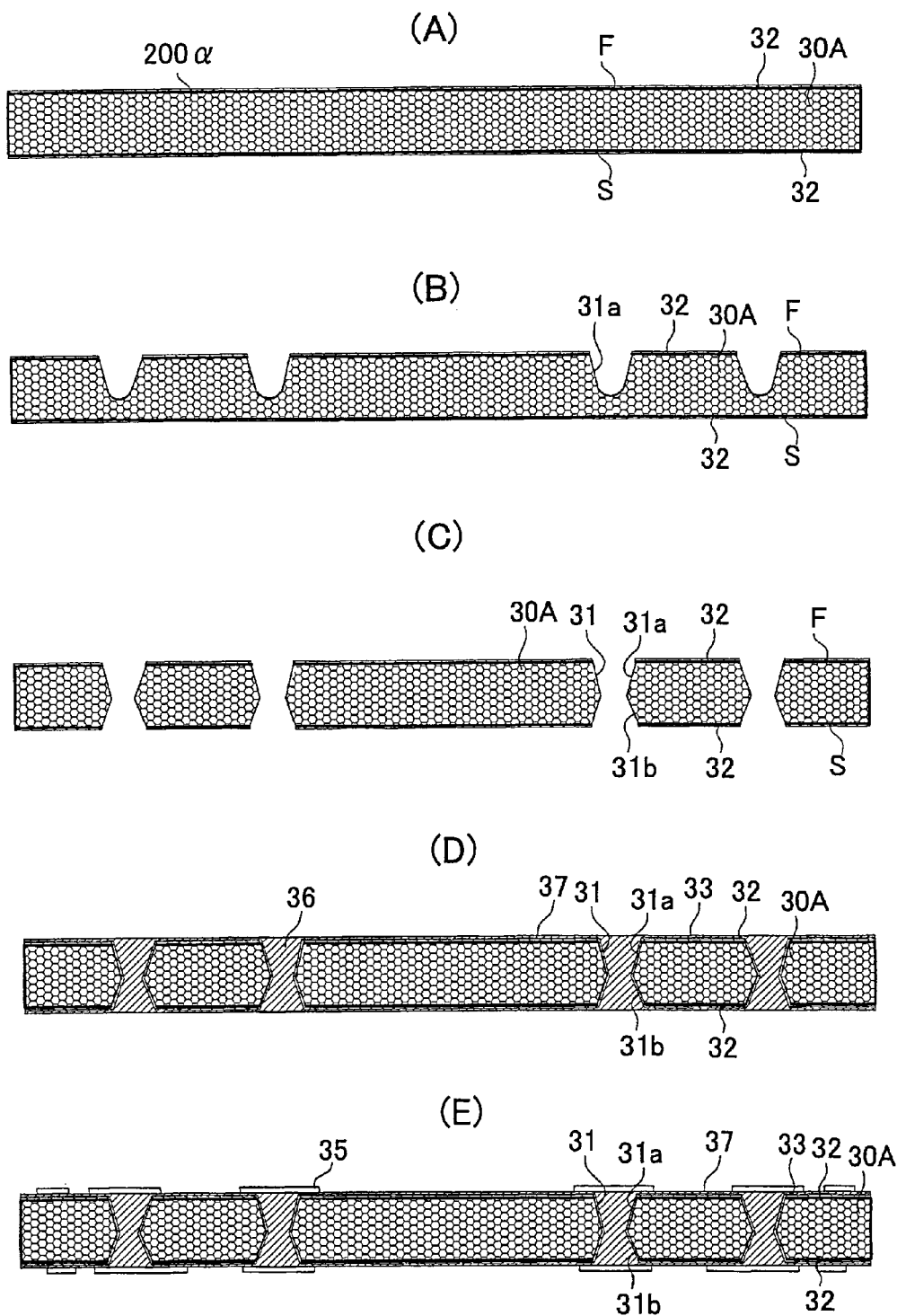
FIGS. 1(A)-(E) are views showing steps of a method for manufacturing a printed wiring board according to a first embodiment of the present invention.
Figure 2:
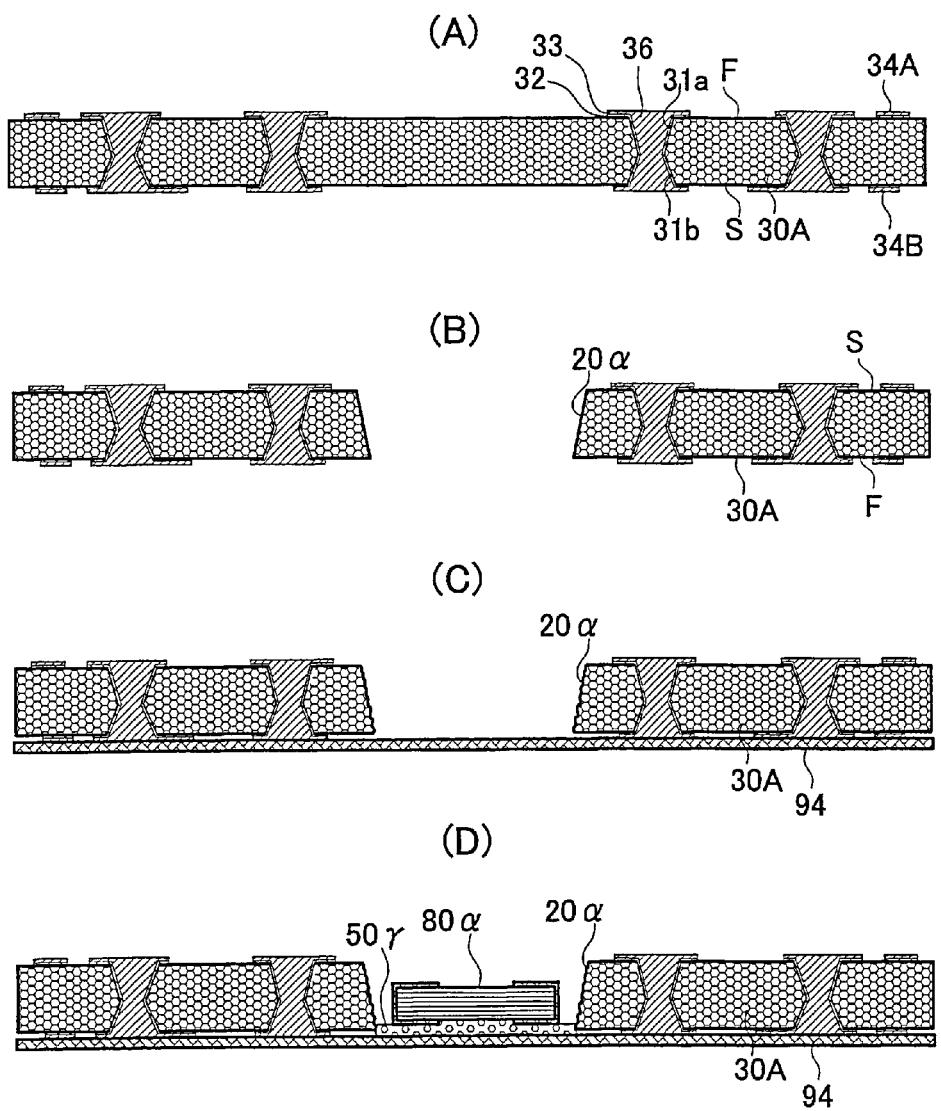
FIGS. 2(A)-(D) are views showing steps of a method for manufacturing a printed wiring board according to the first embodiment.
Figure 3:
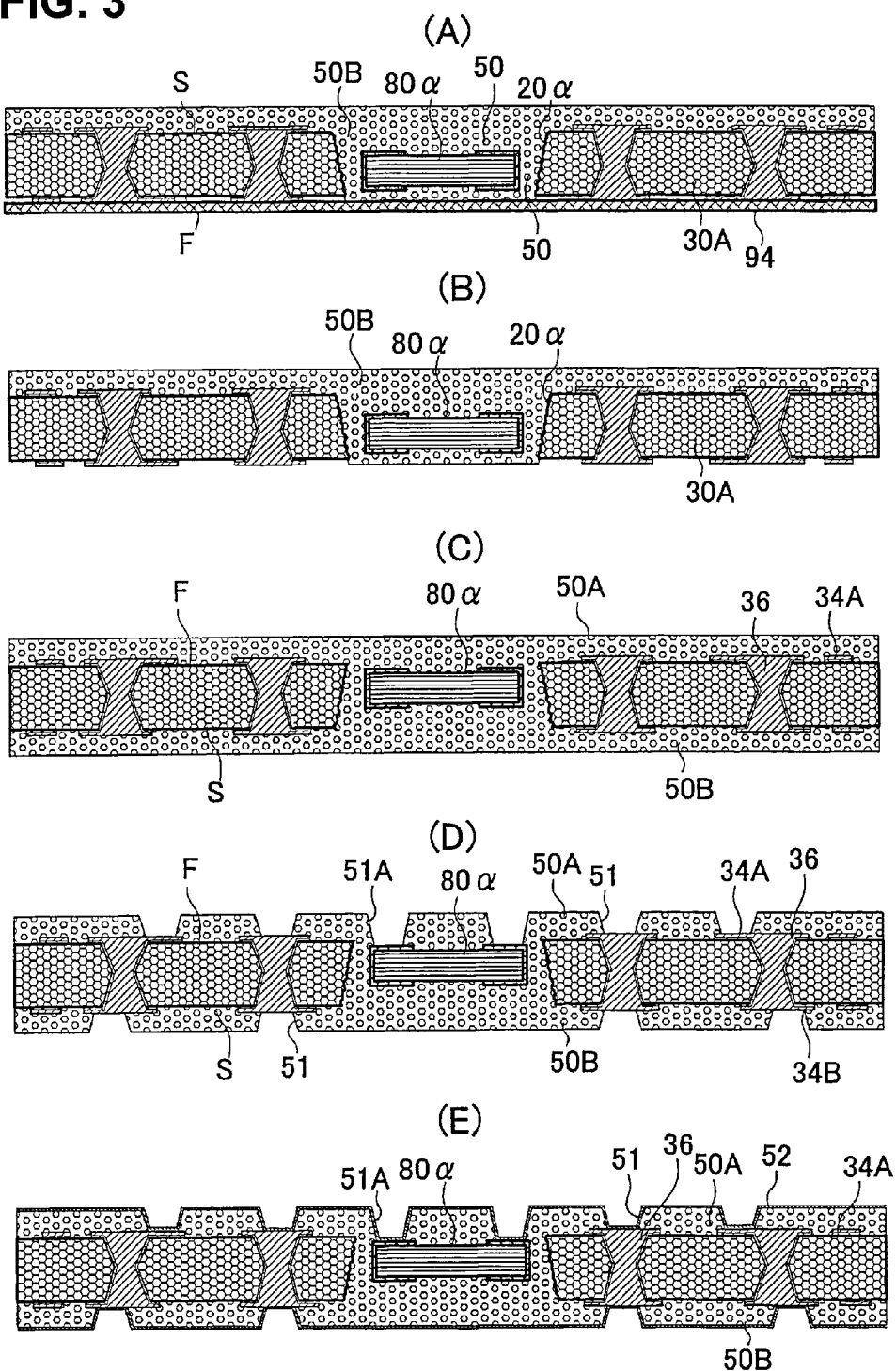
FIGS. 3(A)-(E) are views showing steps of a method for manufacturing a printed wiring board according to the first embodiment.
Figure 4:
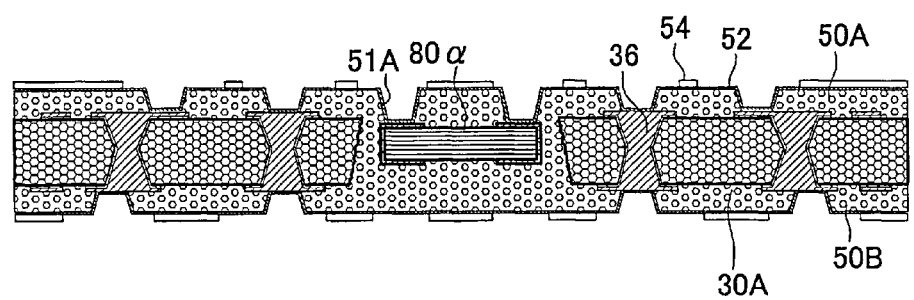
FIGS. 4(A)-(C) are views showing steps of a method for manufacturing a printed wiring board according to the first embodiment.
Figure 4:
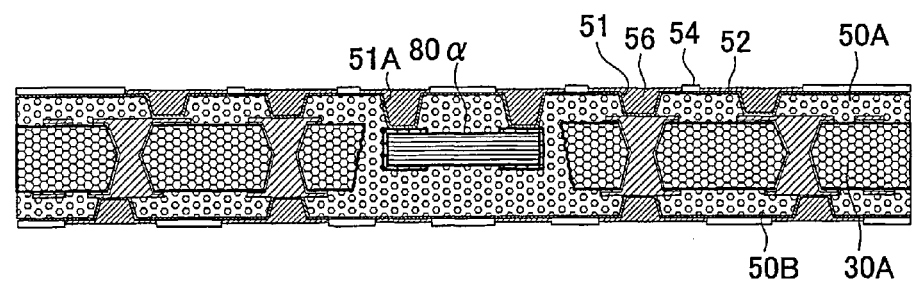
Figure 4:
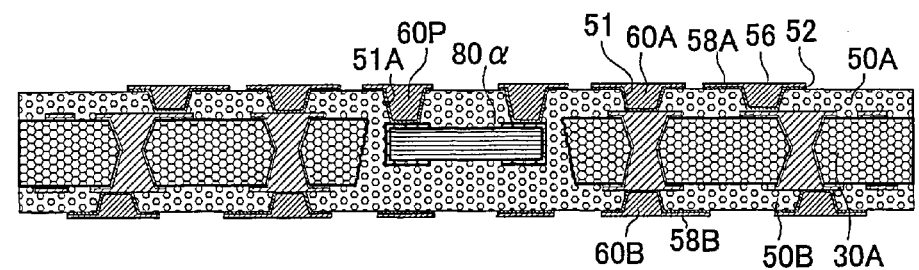
Figure 5:
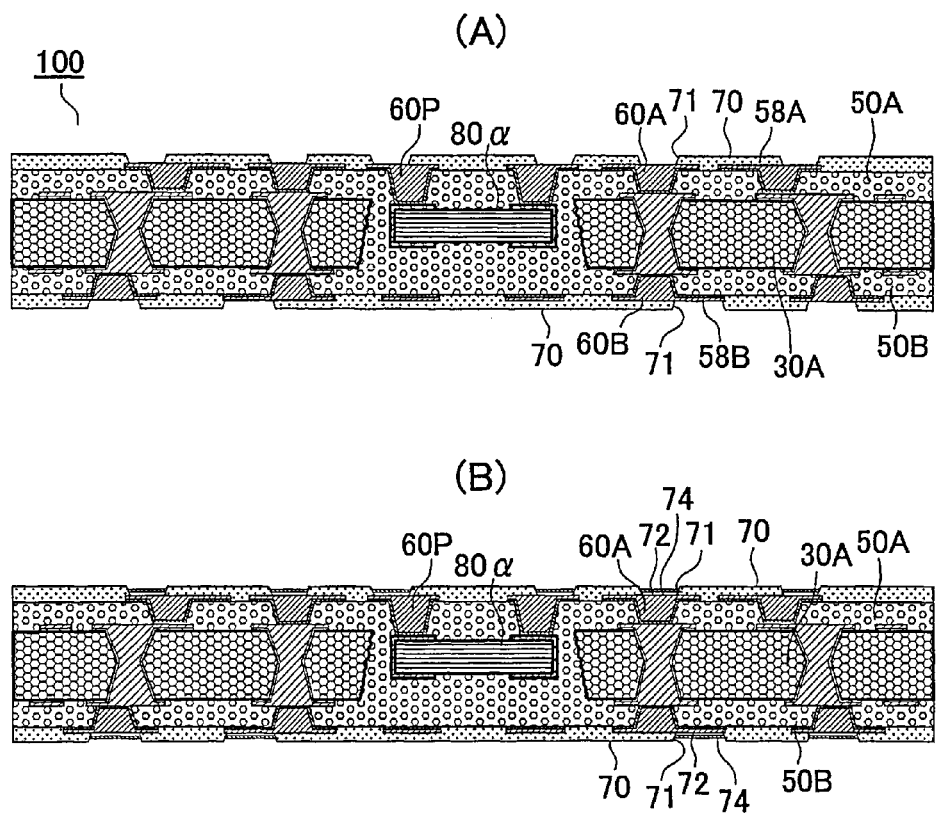
FIGS. 5(A)-(B) are views showing steps of a method for manufacturing a printed wiring board according to the first embodiment.

The embodiments will now be described with reference to the accompanying drawings, wherein like reference numerals designate corresponding or identical elements throughout the various drawings.

First Embodiment

Figure 6:
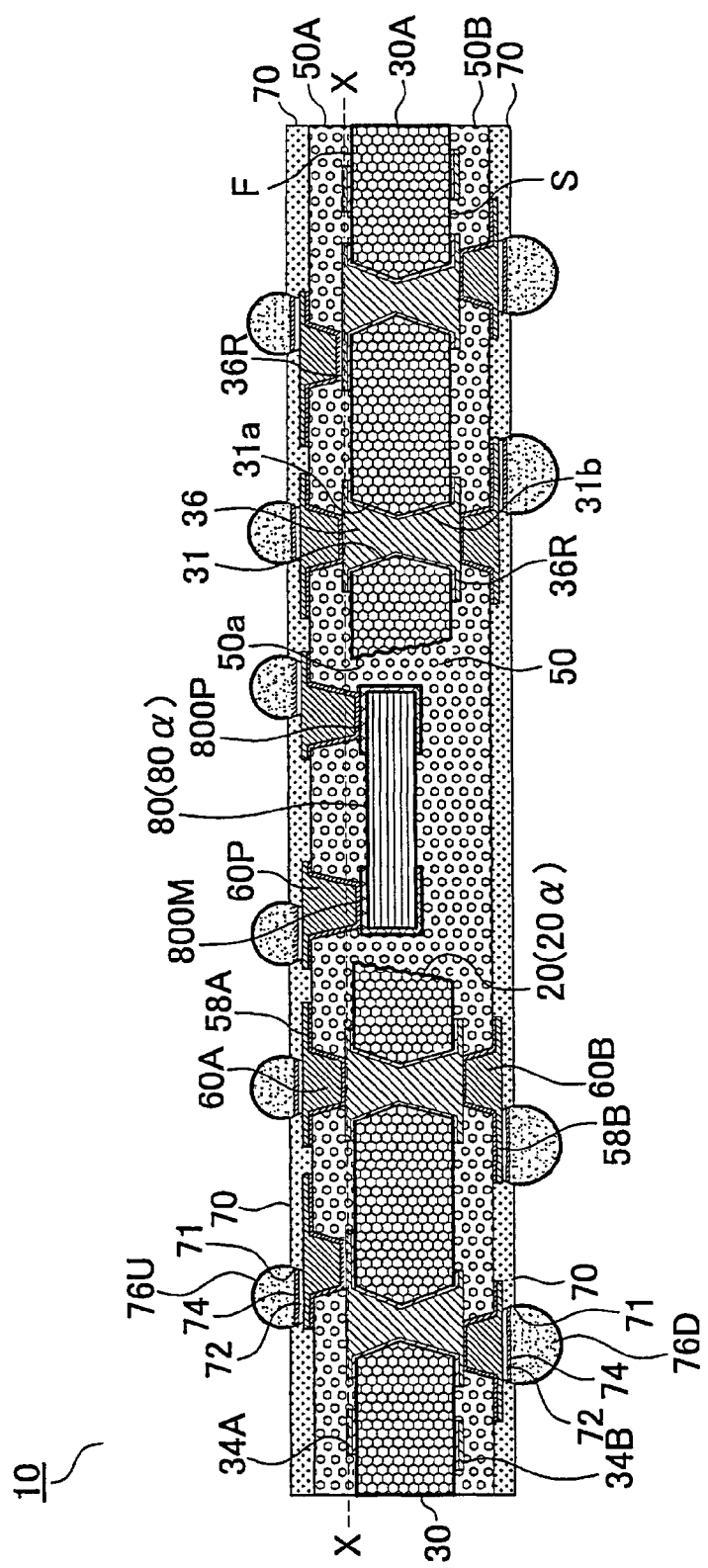
FIG. 6 is a cross-sectional view of a printed wiring board according to the first embodiment.
Figure 8:
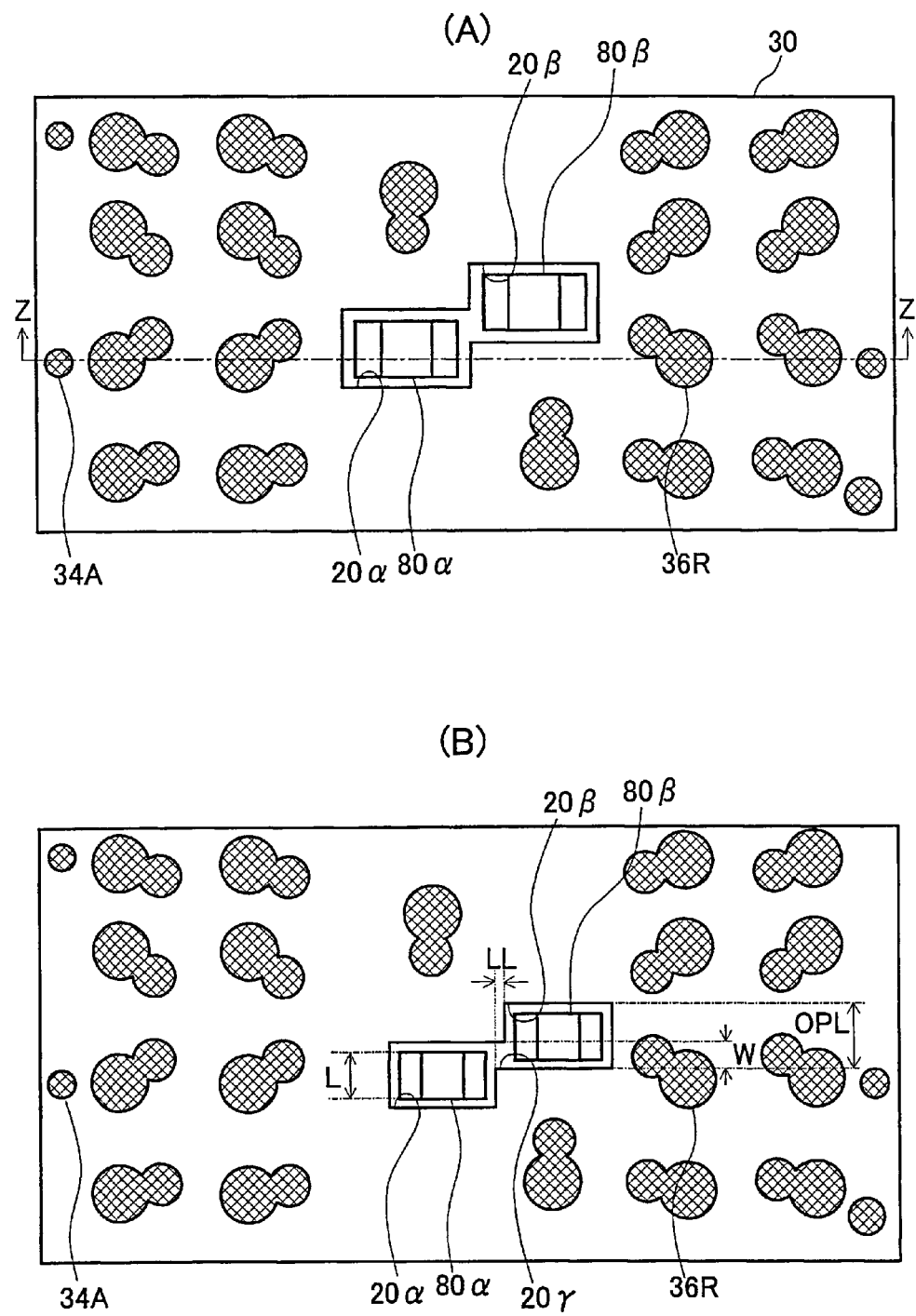
FIG. 8(A) is a plan view of the core substrate of the first embodiment.
FIG. 8(B) is a plan view of a core substrate according to a fourth embodiment.

FIG. 6 shows a cross-sectional view of a printed wiring board according to a first embodiment of the present invention. An X-Y cross section of FIG. 6 is shown in FIG. 8(A). FIG. 6 includes a Z-Z cross section of FIG. 8(A).

Printed wiring board 10 of the first embodiment includes the following: core substrate 30 with accommodation section 20 to accommodate electronic components 80; electronic components 80 accommodated in accommodation section 20; filler resin 50 formed in accommodation section 20 to secure electronic components 80 to the core substrate; and a buildup layer formed on core substrate 30 and electronic components 80. The gap between the side walls of the accommodation section and the electronic components is filled with filler resin 50.

Core substrate 30 is formed with the following: insulative base (30A) having first surface (F) and second surface (S) opposite the first surface; first conductive layer (34A) on the first surface of insulative base (30A); second conductive layer (34B) on the second surface of insulative base (30A); through-hole conductors 36 connecting the first conductive layer and the second conductive layer; and accommodation section 20 reaching from the first surface of the insulative base to the second surface. The first and second conductive layers include conductive circuits and lands (36R) of through-hole conductors. Through-hole conductors 36 are formed by filling plated film in penetrating holes 31 for through-hole conductors formed in the core substrate. Penetrating hole 31 is made up of first opening (31a) formed on the first-surface side of the insulative base and of second opening (31b) formed on the second-surface side. First opening (31a) tapers from the first surface toward the second surface. Second opening (31b) tapers from the second surface toward the first surface. First opening (31a) and second opening (31b) are connected inside the core substrate.

Figure 7:
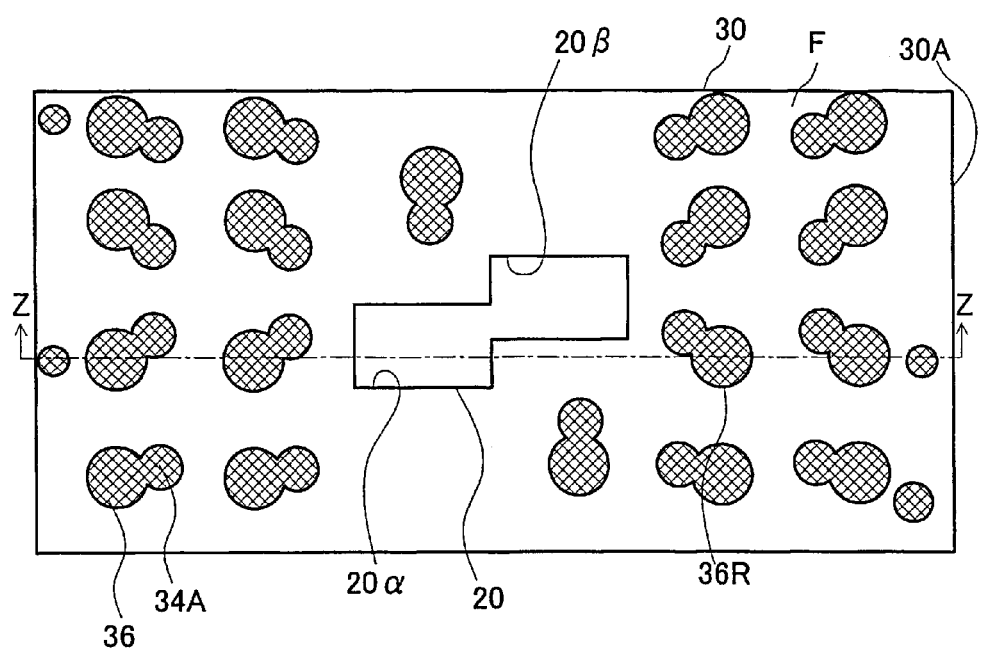
FIG. 7 is a plan view of a core substrate of the first embodiment.

FIG. 7 is a plan view of the core substrate, showing first surface (F) of the insulative base, the first conductive layer, through-hole conductors and accommodation section 20. Accommodation section 20 is formed with multiple opening portions (20N) (first opening portion (20α) and second opening portion (20β)). As shown in FIG. 7, the core substrate has multiple opening portions (20N) (first opening portion (20α) and second opening portion (20β), and adjacent first opening portion (20α) and second opening portion (20β) are not independent but are partially connected. The first opening portion and the second opening portion overlap partially. The first opening portion and the second opening portion share part of their sides. Electronic components (80α, 80β) are respectively built into opening portions (20α, 20β) (FIG. 8(A)). FIG. 8(A) shows capacitors as examples of electronic components. Here, the size of each opening portion (20α, 20β) is 1.1 to 1.7 times the size of the external shape of each electronic component. When the size of opening portions is set in that range, it is easy to place electronic components into the opening portions. Also, since the volume that the accommodation section occupies within the volume of the core substrate decreases, warping of the printed wiring board is reduced. In FIG. 8(A), a short side of opening portion (20α) and a short side of opening portion (20β) are connected.

Figure 11:
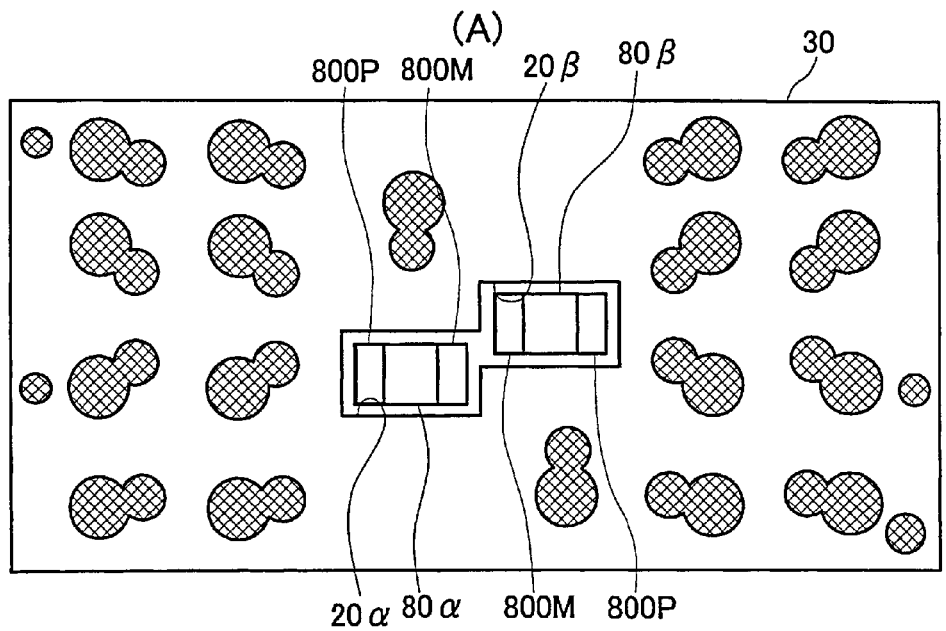
FIGS. 11(A)-(B) are plan views of core substrates showing examples of the positioning of electronic components in opening portions.
Figure 11:
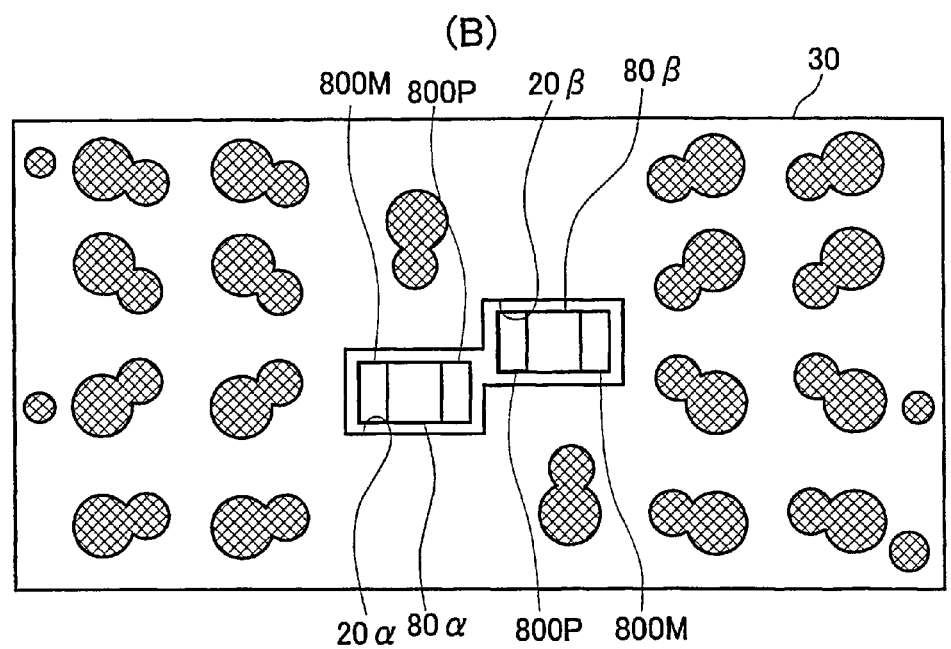

One electronic component is built into each opening portion. When multiple electronic components are built into a core substrate, the risk of electronic components colliding with each other is minimized. Therefore, the built-in electronic components show the same quality initially designed prior to being built into the substrate. When the electronic components are capacitors, abnormal capacitance of the capacitors or short circuiting between the adjacent electronic components is prevented. When the electronic components are capacitors, capacitors are preferred to be accommodated in adjacent opening portions so that anodes face each other or cathodes face each other (FIG. 11). In the drawings, (800M) and (800P) show electrodes; (800M) are cathodes and (800P) are anodes.

Figure 10:
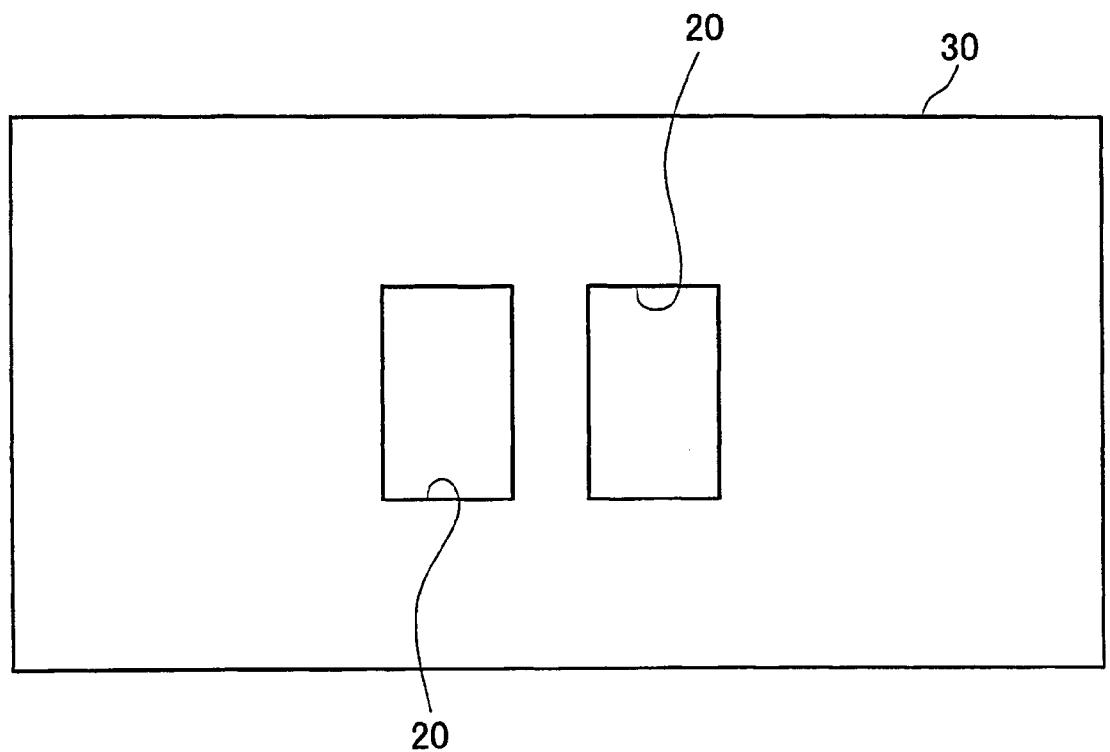
FIG. 10 is a plan view of a core substrate showing an example where opening portions are formed.

Compared with cases in which each opening portion is formed independently (FIG. 10), since adjacent opening portions (20α, 20β) are partially connected, the size of accommodation section 20 to accommodate multiple electronic components decreases. Accordingly, the volume that accommodation section 20 occupies within the volume of the core substrate decreases. Even if multiple electronic components are built into the core substrate, warping or undulation of the printed wiring board is reduced. Also, the printed wiring board becomes smaller. When the printed wiring board becomes smaller, warping or undulation is reduced. If warping or undulation is reduced, stress exerted on the built-in electronic components decreases. Therefore, the electronic components are less likely to be damaged. The electronic components perform as initially designed. Connection reliability is enhanced between the electronic components and via conductors connected to them.

Since one electronic component is built into each opening portion, the amount of movement of electronic components in the opening portions is suppressed. Thus, positional accuracy is improved between electrodes of the electronic components and via-conductor openings to be connected to the electrodes. Accordingly, connection reliability is enhanced between the electrodes of the electronic components and via conductors connected to the electrodes. By contrast, when multiple electronic components are accommodated in one opening portion, the amount of movement of the electronic components in the opening portion is thought to be greater. Thus, connection reliability is thought to be lower between the electronic components and via conductors in the buildup layer.

Electronic components are positioned independently but close to each other in each opening portion. Electronic components are connected to each other by shorter wiring. Signal loss is reduced in the wiring. Also, it is easier to design wiring to connect electronic components. When the electronic components are capacitors, the capacitance obtained from the multiple capacitors is thought to be substantially equal to the sum of the capacitance of each capacitor.

When a multi-core IC chip is mounted on the printed wiring board, since the adjacent opening portions are connected, a capacitor is positioned under each processor core. Using capacitors where the risk of collision is low, power is smoothly supplied to each processor core. Multiple capacitors can be positioned directly under the IC chip. Using multiple capacitors whose quality is the same as initially designed, power is steadily supplied to the IC chip, because connection reliability is high between connection via conductors in the buildup layer and the capacitors.

Insulation layer (resin insulation layer) (50A) is formed on first surface (F) of core substrate 30 and electronic components 80. Conductive layer (58A) is formed on insulation layer (50A). Then, connection via conductors (60P) are formed in insulation layer (50A) to connect electrodes 800 (800P, 800M) of capacitors 80 with conductive layer (58A). In addition, via conductors (60A) are formed so that first conductive layer (34A) and through-hole conductors 36 are connected to conductive layer (58A). The upper buildup layer, which is formed with insulation layer (50A), conductive layer (58a), via conductors (60A) and connection via conductors (60P), is formed on the first surface of the core substrate and the electronic components.

Insulation layer (50B) is formed on second surface (S) of the core substrate and electronic components 80. Conductive layer (58B) is formed on insulation layer (50B). Via conductors (60B) are formed in insulation layer (50B) so that second conductive layer (34B) and through-hole conductors 36 are connected to conductive layer (58B). The lower buildup layer, which is formed with insulation layer (50B), conductive layer (58B) and via conductors (60B), is formed on the second surface of the core substrate and the electronic component.

On the upper and lower buildup layers, solder-resist layers 70 are formed having openings 71 to expose conductive layers (58A, 58B) and via conductors (60A, 60B, 60P). Conductive layers (58A, 58B) and via conductors (60A, 60B, 60P) exposed through openings 71 function as pads. Solder bumps (76U, 76D) are formed on the pads. Solder bumps (76U) are formed on the pads formed in the upper buildup layer. Solder bumps (76D) are formed on the pads formed in the lower buildup layer. An IC chip is mounted on the printed wiring board through solder bumps (76U). The printed wiring board is mounted on a motherboard through solder bumps (76D).

In a printed wiring board of the first embodiment, since opening portions (20α, 20β) are rectangular, rectangular electronic components (80α, 80β) are accommodated in the penetrating holes with excellent positional accuracy. In addition, since the volume of the penetrating holes decreases, warping of the printed wiring board is reduced.

In a printed wiring board of the first embodiment, adjacent opening portions (20α, 20β) are partially connected. The length of the connected portion is shorter than the length of the sides of electronic components (80α, 80β) that face the connected portion. Thus, capacitors (80α, 80β) do not move from their respective opening portions (20α, 20β) to another opening portion adjacent to theirs.

In a printed wiring board of the first embodiment, since the length of the short sides of opening portions (20α, 20β) is shorter than the length of the long sides of rectangular electronic components (80α, 80β), electronic components (80α, 80β) do not rotate in the opening portions. Their positional accuracy is high.

FIGS. 1~5 show a method for manufacturing printed wiring board 10 of the first embodiment.

(1) A starting material is copper-clad laminate (200α) which is formed with insulative base (30A) made of glass-epoxy resin or BT (bismaleimide triazine) resin and copper foils 32 laminated on both of its surfaces (FIG. 1(A)). The insulative base has first surface (F) and second surface (S) opposite the first surface, and its thickness is in the range of 100~250 μm. If the thickness is less than 100 μm, the strength of the insulative base is low. If the thickness exceeds 250 μm, it is difficult using a laser to form opening portions for accommodating electronic components. The thickness of electronic components such as capacitors to be accommodated in the opening portions is preferred to be approximately 120~200 μm. The thickness of copper foil is 3 μm to 15 μm.

(2) A CO2 laser is irradiated at copper-clad laminate (20α) from the first-surface side of insulative base (30A) to form first openings (31a) on the first-surface (F) side of insulative base (30A) (FIG. 1(B)). First openings (31a) taper from first surface (F) toward second surface (S).

(3) A CO2 laser is irradiated at copper-clad laminate (20α) from the second-surface side of insulative base (30A) to form second openings (31b) on the second-surface (S) side of insulative base (30A) (FIG. 1(C)). Second openings (31b) taper from second surface (S) toward first surface (F). Penetrating holes 31 for through-hole conductors are formed by connecting the second openings to the first openings in the insulative base.

(4) Electroless plating is performed to form electroless plated film 33 on the inner walls of penetrating holes 31 and on copper foils. Next, electrolytic plated film 37 is formed on electroless plated film 33. Penetrating holes 31 are filled with plated film. Through-hole conductors 36 are formed (FIG. 1(D)).

(5) Etching resist 35 with a predetermined pattern is formed on electrolytic plated film 37 (FIG. 1(E)).

(6) Electrolytic plated film 37, electroless plated film 33 and copper foil 32 exposed from the etching resist is removed. Then, the etching resist is removed. Conductive layers 34 (34A, 34B) are formed on the first and second surfaces of the insulative base. The conductive layer formed on the first surface of the insulative base is first conductive layer (34A), and the conductive layer formed on the second surface of the insulative base is second conductive layer (34B). Each conductive layer includes multiple conductive circuits and lands of through-hole conductors. At the same time, through-hole conductors 36 connecting the first conductive layer and the second conductive layer are formed (FIG. 2(A)).

(7) Using a laser, multiple opening portions (20α, 20β) are formed in insulative base (30A) to accommodate electronic components (FIG. 2(B), FIG. 7). Core substrate 30 is completed. The core substrate has a first surface and a second surface opposite the first surface. The first surface of the core substrate corresponds to the first surface of the insulative base, the second surface of the core substrate corresponds to the second surface of the insulative base. FIG. 7 shows a plan view of core substrate 30. A Z-Z cross section in FIG. 7 is shown in FIG. 2(B). Side walls of each opening portion (20α, 20β) taper from second surface (S) toward first surface (F). The size of an opening of each opening portion on the second surface is greater than the size of an opening on the first surface. Accommodation section 20 is made up of opening portion (20α) and second opening portion (20β). Opening portion (20α) and opening portion (20β) overlap partially. A side of opening portion (20α) overlaps a side of opening portion (20β).

(8) Tape 94 made of PET film is placed on the first surface of the core substrate so that accommodation section 20 is covered (FIG. 2(C)).

(9) Using dispenser equipment, resin film (adhesive film) (50γ) is formed on tape 94. Capacitors are mounted on resin film (50γ) using a mounter. Electronic component (80α) is mounted on the tape in opening portion (20α) with resin film (50γ) placed in between. Also, electronic component (80β) is mounted on the tape in opening portion (20β) with resin film (50γ) placed in between. One electronic component is positioned in each opening portion (FIG. 2(D), FIG. 8(A)). The electronic components may be positioned directly on the tape.

(10) B-stage prepreg is laminated on second surface (S) of core substrate 30. Insulation layer (50B) is formed on the second surface of the core substrate and the electronic components through thermal pressing. During that time, resin and inorganic particles seep out from the prepreg into the gap in the accommodation section. Then, the resin is cured and filler resin 50 is formed in each opening portion to secure the electronic components (FIG. 3(A)). The filler resin is filled in the gap between the side walls of the accommodation section and electronic components. The insulation layer is formed with inorganic particles and resin. The insulation layer may further contain reinforcing material such as glass cloth.

Figure 14:
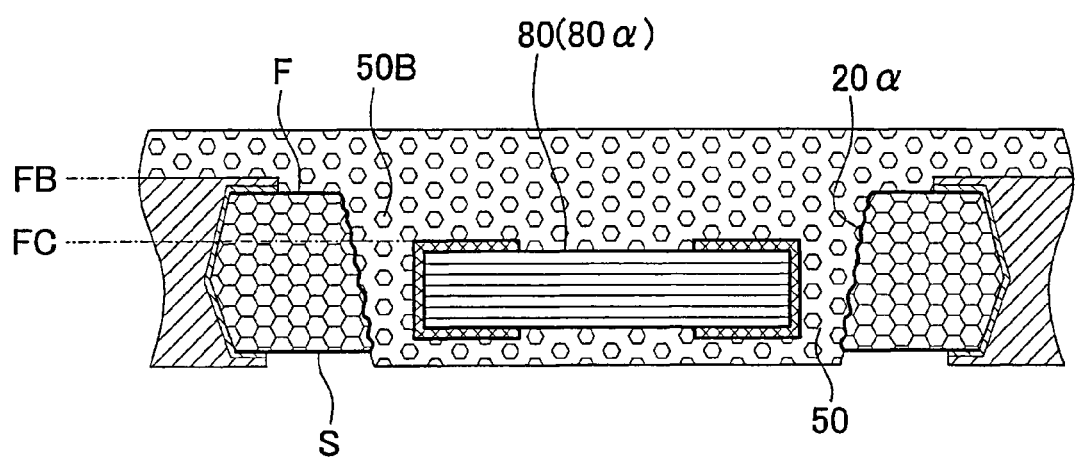
FIG. 14 is a magnified view showing the vicinity of an opening portion.

(11) After the tape is removed (FIG. 3(B)), B-stage prepreg is laminated on first surface (F) of core substrate 30. Next, insulation layer (50A) is formed on the first surface of the core substrate and the electronic components through thermal pressing (FIG. 3(C)). Main surfaces (upper surfaces of electrodes) (FC) of the electronic components are preferred to be positioned below the main surface (upper surface of the first conductive layer) (FB) of the core substrate (FIG. 14). The length of a connection via conductor in the upper buildup layer reaching the upper surface of an electrode is longer than the length of a via conductor in the upper buildup layer reaching the first conductive layer. Connection reliability is enhanced between electrodes of electronic components and via conductors connected to them. Also, when insulation layer (50A) is formed, the electronic components are less likely to be damaged by thermal pressing.

(12) Using a CO2 gas laser from the first-surface (F) side, via-conductor openings (openings for connection via conductors in the upper buildup layer) (51A) reaching electrodes 800 of the capacitors are formed in insulation layer (50A). At the same time, via-conductor openings 51 reaching conductive layer (34A) and through-hole conductors 36 are formed. Via-conductor openings 51 reaching conductive layer (34B) and through-hole conductors are formed in insulation layer (50B) from the second-surface side (see FIG. 3(D)).

(13) Electroless plating is performed to form electroless plated film 52 on surfaces of the insulation layers and on the inner walls of via-conductor openings (FIG. 3(E)).

(14) Plating resist 54 is formed on electroless plated film 52 (FIG. 4(A)).

(15) Next, electrolytic plating is performed to form electrolytic plated film 56 on electroless plated film 52 (see FIG. 4(B)).

(16) Plating resist 54 is removed. Then, electroless plated film 52 between portions of electrolytic plated film is removed. Conductive circuits (58A, 58B) and via conductors (60A, 60B, 60P), which are made up of electroless plated film 52 and electrolytic plated film 56, are formed (FIG. 4C). Via conductors (60P) are connection via conductors in the upper buildup layer. Upper and lower buildup layers are completed.

(17) On the upper and lower buildup layers, solder-resist layers 70 are formed having openings 71 to expose conductive layers (58A, 58B) and via conductors (60A, 60B, 60P) (FIG. 5(A)). Conductive layers (58A, 58B) and via conductors (60A, 60B, 60P) exposed through openings 71 function as pads. Printed wiring board 100 is completed.

(18) Nickel-plated layer 72 and gold-plated layer 74 in that order are formed on pad layers (FIG. 5(B)).

(19) Then, solder bumps (76U) are formed on the pads in the upper buildup layer, and solder bumps (76D) are formed on the pads in the lower buildup layer so that printed wiring board 10 with solder bumps is completed (FIG. 6).

An IC chip is mounted on printed wiring board 10 through solder bumps (76U).

Second Embodiment

Figure 12:
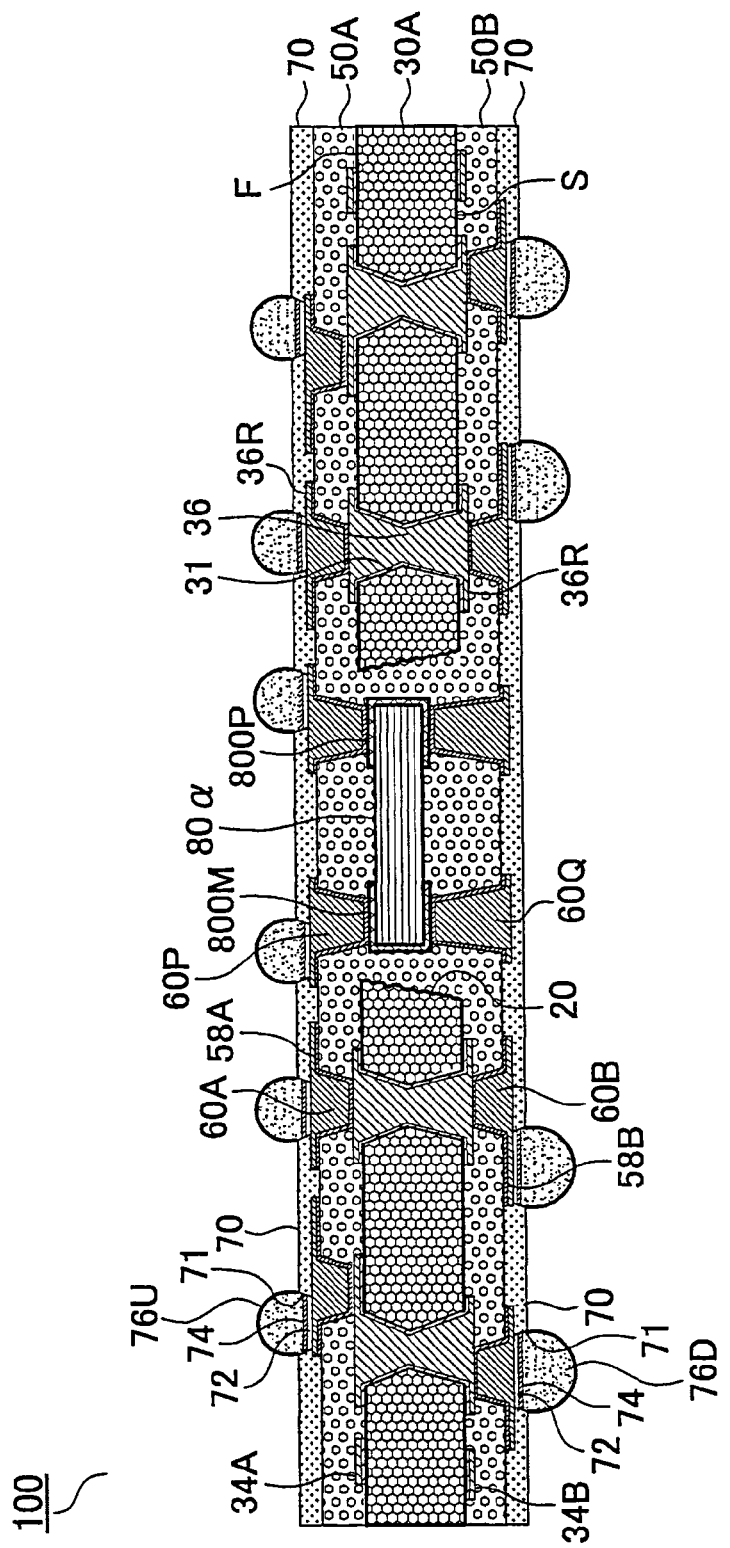
FIG. 12 is a cross-sectional view of a printed wiring board according to a second embodiment.

FIG. 12 shows a cross-sectional view of a printed wiring board according to a second embodiment of the present invention. Compared with a printed wiring board of the first embodiment, a printed wiring board of the second embodiment further includes via conductors in the lower buildup layer (connection via conductors in the lower buildup layer) (60Q) reaching the electrodes of the electronic components. Since the electronic components are sandwiched by via conductors (60P, 60Q), connection reliability is enhanced between the electronic components and via conductors (60P, 60Q). The printed wiring board of the second embodiment has the same effects as in the first embodiment.

Third Embodiment

Figure 9:
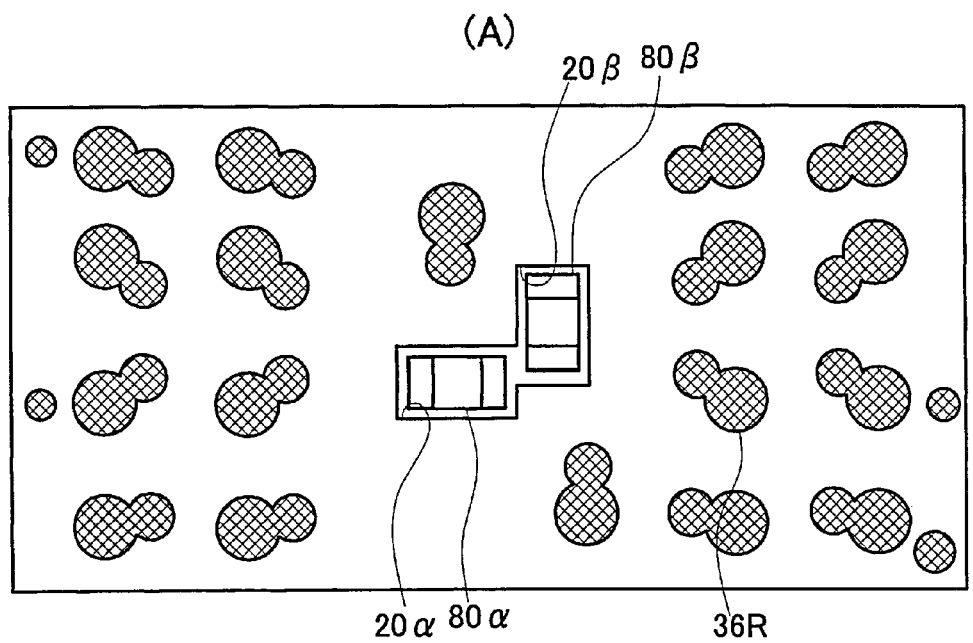
FIG. 9(A) is a plan view of a core substrate according to a third embodiment.
FIG. 9(B) is a plan view of a core substrate according to a fifth embodiment.
Figure 9:
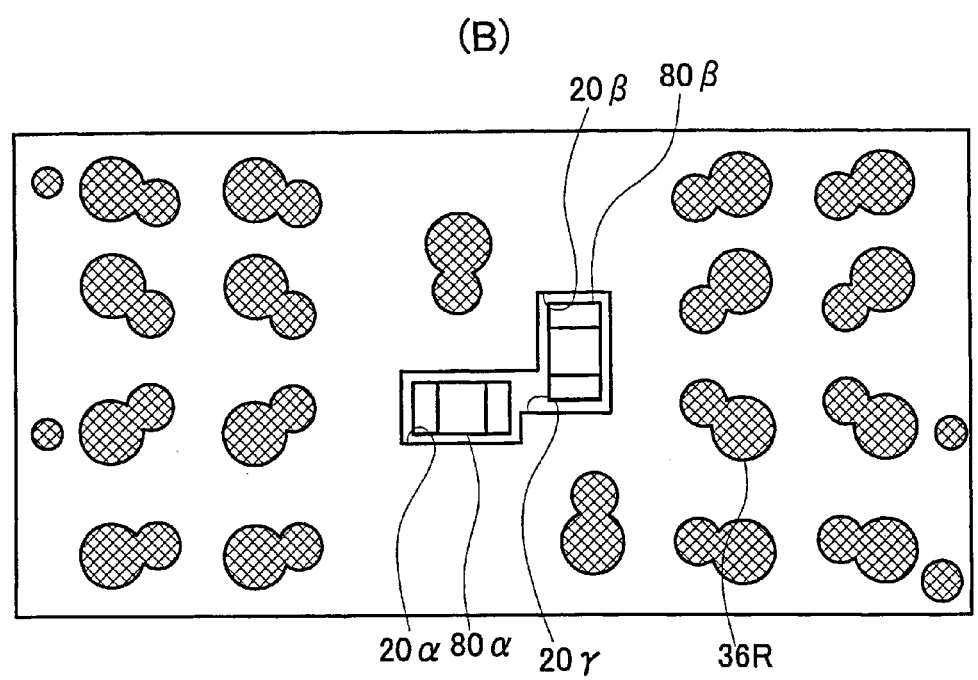

FIG. 9(A) shows a plan view of a core substrate of a printed wiring board according to a third embodiment. In the third embodiment, a short side of opening portion (20α) is partially connected to a long side of opening portion (20β). The short side of opening portion (20α) partially overlaps the long side of opening portion (20β). Except for the shape of the accommodation section, a printed wiring board of the third embodiment is the same as the printed wiring board of the first embodiment. The printed wiring board of the third embodiment has the same effects as in the first embodiment.

Fourth Embodiment

FIG. 8(B) shows a plan view of a core substrate of a printed wiring board according to a fourth embodiment. In the fourth embodiment, opening portion (20α) and opening portion (20β) are connected by groove portion (20γ). Accommodation section 20 is made up of opening portion (20α), opening portion (20β) and groove portion (20γ). Groove portion (20γ) exists between opening portion (20α) and opening portion (20β). Length (L) of a side of an electronic component facing the groove portion is longer than width (W) of the groove portion (FIG. 8(B)). Therefore, the electronic component accommodated in opening portion (20α) and the electronic component accommodated in (20β) do not collide or touch each other. Such a groove portion may penetrate through the insulative base or may be a recessed portion. The width of the groove portion is smaller than a side of an opening portion or a side of an electronic component. Length (LL) of the groove portion is 10%~50% of width (OPL) of the opening portions. If the length of a groove portion is shorter, the size of the accommodation section decreases. Thus, the strength of the core substrate increases. FIG. 8(B) shows an example where a short side of opening portion (20α) faces a short side of opening portion (20β).

Fifth Embodiment

FIG. 9(B) shows a plan view of a core substrate of a printed wiring board according to a fifth embodiment. In the fifth embodiment, a short side of opening portion (20α) faces a long side of opening portion (20β), and they are connected by groove portion (20γ).

In any embodiment, the size of an opening portion is set to be 1.1 times to 1.7 times the size of an electronic component. Also, in any embodiment, when length (OL) of the portion where adjacent opening portions overlap is divided by length (OPL) of a side of an opening portion, the result is set to be 0.3~0.95 (FIG. 15(A)). When width (W) of a groove portion is divided by length (OPL) of a side of an opening portion, the result is set to be 0.3~0.95 (FIG. 8B)).

Sixth Embodiment

Figure 13:
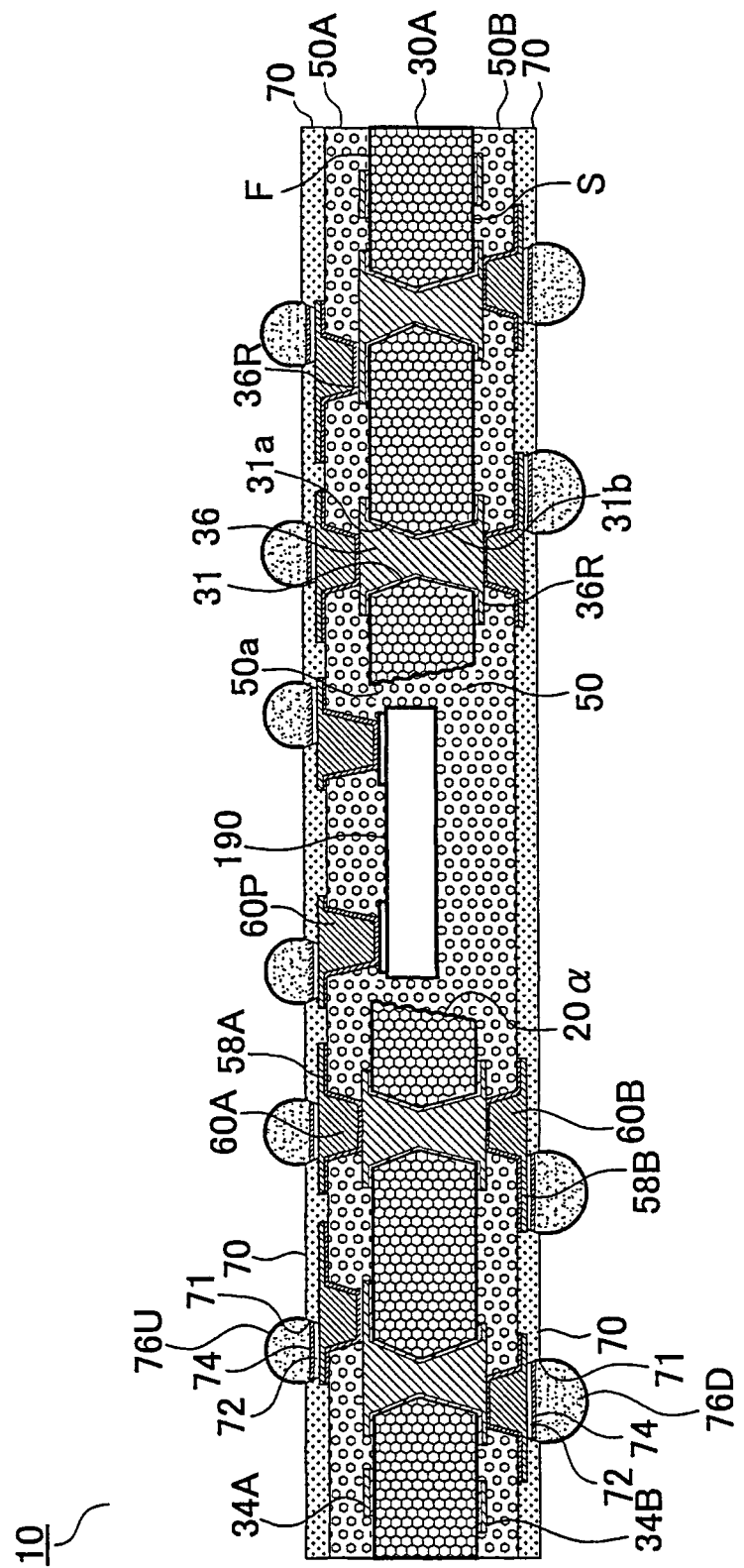
FIG. 13 is a cross-sectional view of a printed wiring board according to a sixth embodiment.

FIG. 13 shows a printed wiring board according to a sixth embodiment. In a printed wiring board according to the first embodiment, the electronic components built into a printed wiring board are capacitors. By contrast, IC chips 190 are built into a printed wiring board of the sixth embodiment. The rest of the printed wiring board in the sixth embodiment is the same as the printed wiring board of the first embodiment. The printed wiring board of the sixth embodiment has the same effects as those shown in the printed wiring board of the first embodiment.

Example (1) A starting material is copper-clad laminate (model number: ELC4785TH) (200α) made by Sumitomo Bakelite Co., Ltd. (FIG. 1(A)). The thickness of insulative base (30A) as a starting material is 150 µm, and the thickness of the copper foil is 3 µm. The insulative base has a first surface and a second surface opposite the first surface.

(2) A CO2 laser is irradiated at copper-clad laminate (20α) from the first-surface side of insulative base (30A) to form first openings (31$a$) on the first-surface (F) side of insulative base (30A) (FIG. 1(B)).

(3) A CO2 laser is irradiated at copper-clad laminate (20α) from the second-surface side of insulative base (30A) to form second openings (31$b$) on the second-surface (S) side of insulative base (30A) (FIG. 1(C)). Penetrating holes 31 for through-hole conductors are formed by connecting the second openings to the first openings in the insulative base.

(4) Electroless copper-plated film 33 is formed on the inner walls of penetrating holes 31 and on the copper foils. Then, electrolytic plated film 37 is formed on electroless plated film 33. Penetrating holes 31 are filled with copper-plated film. Through-hole conductors 36 are formed (FIG. 1(D)).

(5) Etching resist 35 with a predetermined pattern is formed on electrolytic plated film 37 (FIG. 1(E)).

(6) Electrolytic copper-plated film 37, electroless copper-plated film 33 and copper foil 32 exposed from the etching resist is removed. Then, the etching resist is removed. Conductive layers 34 are formed on the first and second surfaces of the insulative base (FIG. 2(A)). The thickness of conductive layers 34 is 25 µm.

(7) Using a laser, multiple opening portions (20α, 20β) to accommodate electronic components are formed in insulative base (30A) (FIG. 2(B)). Core substrate 30 is completed. FIG.

7 shows a plan view of core substrate 30. A side of opening portion (20α) overlaps a side of opening portion (20β).

(8) PET film 94 is laminated on the core substrate so that accommodation section 20 is covered (FIG. 2(C)).

(9) Using dispenser equipment, resin film (adhesive film) (50γ) is formed on tape 94. Using a mounter, capacitors made by Murata Manufacturing Co., Ltd. (model number: GRM155R60G106M) are mounted on resin film (50γ) (FIG. 2(D)). One capacitor is positioned in each opening portion. The dimensions are length: 1 mm, width: 0.5 mm, and thickness: 140 μm.

(10) B-stage ABF-GX13GC (made by Ajinomoto Fine-Techno Co., Inc.) is laminated on second surface (S) of core substrate 30. Insulation layer (50B) is formed on the second surface of the core substrate and electronic components through thermal pressing. During that time, resin and inorganic particles seep out from the prepreg into a gap in the accommodation section. Then, the resin is cured and filler resin 50 is formed to secure the electronic components in their respective opening portions (FIG. 3(A)).

(11) After the tape is removed (FIG. 3(B)), B-stage ABF-GX13GC (made by Ajinomoto Fine-Techno Co., Inc.) is laminated on first surface (F) of core substrate 30. Then, insulation layer (50A) is formed on the first surface of the core substrate and on electronic components through thermal pressing (FIG. 3(C)).

(12) Using a CO2 gas laser from the first-surface (F) side, via-conductor openings (51A) reaching electrodes 800 of the capacitors are formed in insulation layer (50A). At the same time, via-conductor openings 51 reaching conductive layer (34A) and through-hole conductors 36 are formed. Via-conductor openings 51 reaching conductive layer (34B) and through-hole conductors are formed from the second-surface side in insulation layer (34B) (see FIG. 3(D)).

(13) Electroless copper-plated film 52 is formed on surfaces of the insulation layers and inner walls of via-conductor openings (FIG. 3(E)).

(14) Plating resist 54 is formed on electroless plated film 52 (FIG. 4(A)).

(15) Next, electrolytic plating is performed to form electrolytic plated film 56 on electroless plated film 52 (see FIG. 4(B)).

(16) Plating resist 54 is removed. Then, electroless plated film 52 between portions of electrolytic plated film is removed. Conductive circuits (58A, 58B) and via conductors (60A, 60B, 60P), which are made up of electroless copper-plated film 52 and electrolytic copper-plated film 56, are formed (FIG. 4(C)). Upper and lower buildup layers are completed.

(17) On the upper and lower buildup layers, solder-resist layers 70 having opening portions 71 to expose conductive circuits (58A, 58B) and via conductors (60A, 60B, 60P) are formed (FIG. 5(A)). Printed wiring board 10 is completed.

FIG. 15(B) shows an example where opening portion (20α) and opening portion (20β) are connected obliquely.

Each embodiment shows an example of two opening portions. However, it is also an option to form an accommodation section with three or more opening portions. In addition, passive elements such as inductor and resistor or active elements such as IC chips may also be built into a printed wiring board.

A printed wiring board according to an embodiment of the present invention has the following: a substrate having an accommodation section formed with multiple opening portions to accommodate electronic components; electronic components accommodated in their respective multiple opening portions; filler resin to secure the electronic components in their respective opening portions; a resin insulation layer formed on the substrate and the electronic components; a conductive layer formed on the resin insulation layer; and via conductors formed in the resin insulation layer and connecting the conductive layer and the electronic components. In such a printed wiring board, adjacent opening portions among the multiple opening portions are partially connected.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a substrate having an accommodation section having a plurality of opening portions, each penetrating through the substrate having a substantially rectangular shape;
   a plurality of electronic components accommodated in the plurality of opening portions, respectively;
   a filler resin provided in the opening portions in the substrate such that the electronic components are secured in the opening portions in the substrate;
   a resin insulation layer formed over the substrate and the electronic components; a conductive layer formed on the resin insulation layer; and
   a plurality of via conductors formed in the resin insulation layer and connecting the conductive layer and the electronic components,
   wherein the plurality of opening portions is formed such that adjacent opening portions are only partially connected to each other in the substrate in a same horizontal plane and that each of the opening portions is configured to accommodate one of the electronic components.

2. The printed wiring board according to claim 1, wherein the electronic components are chip capacitors.

3. The printed wiring board according to claim 1, wherein the opening portions in the substrate have rectangular shapes.

4. The printed wiring board according to claim 3, wherein the opening portions have short sides with a length which is set shorter than a length of long sides of the electronic components.

5. The printed wiring board according to claim 1, wherein the opening portions in the substrate are formed such that the adjacent opening portions are adjoining and have a directly connected portion with a length which is set shorter than a length of sides of the electronic components opposite to the directly connected portion.

6. The printed wiring board according to claim 1, wherein the opening portions in the substrate are formed such that the adjacent opening portions are connected through a groove portion formed between the adjacent opening portions in the substrate.

7. The printed wiring board according to claim 1, wherein the plurality of opening portions includes a first opening portion and a second opening portion.

8. The printed wiring board according to claim 1, wherein the plurality of opening portions includes a first opening portion and a second opening portion connected to the first opening portion, the first opening portion and the second opening portion are tapering from a first surface of the substrate toward a second surface of the substrate on an opposite side of the first surface of the substrate.

9. The printed wiring board according to claim 1, wherein each of the opening portions in the substrate has a size which is in a range of from 1.1 to 1.7 times a size of an external shape of a respective one of the electronic components.

10. The printed wiring board according to claim 1, wherein the opening portions are tapering from one surface of the substrate toward an opposite surface of the substrate.

11. The printed wiring board according to claim 1, wherein the filler resin is a portion of a resin derived from the resin insulation layer.

12. The printed wiring board according to claim 1, wherein the plurality of opening portions includes a first opening portion and a second opening portion connected to the first opening portion, and the first opening portion has a side partially connected to a side of the second opening portion such that the first opening portion is communicated with the second opening portion.

13. The printed wiring board according to claim 1, wherein the plurality of opening portions includes a first opening portion and a second opening portion connected to the first opening portion, and the first opening portion has a side partially connected to a side of the second opening portion such that the first opening portion is communicated with the second opening portion.

14. The printed wiring board according to claim 1, wherein the plurality of opening portions includes a first opening portion and a second opening portion connected to the first opening portion, and the first opening portion has a side connected to a side of the second opening portion through a groove portion formed between the first opening portion and the second opening portion such that the first opening portion is communicated with the second opening portion.

15. The printed wiring board according to claim 1, wherein the plurality of opening portions includes a first opening portion and a second opening portion connected to the first opening portion, and the first opening portion has a side connected to a side of the second opening portion through a groove portion formed between the first opening portion and the second opening portion such that the first opening portion is communicated with the second opening portion.

16. The printed wiring board according to claim 1, wherein the plurality of opening portions includes a first opening portion and a second opening portion connected to the first opening portion, and the first opening portion and the second opening portion are positioned obliquely with respect to each other.

17. The printed wiring board according to claim 1, wherein the plurality of opening portions includes a first opening portion and a second opening portion connected to the first opening portion, the first opening portion has a side connected to a side of the second opening portion through a groove portion formed between the first opening portion and the second opening portion such that the first opening portion is communicated with the second opening portion, and the groove portion of the substrate has a length which is in a range of from 10% to 50% of widths of the first and second opening portions.

18. The printed wiring board according to claim 1, wherein the plurality of opening portions includes a first opening portion and a second opening portion connected to the first opening portion, the first opening portion has a side connected to a side of the second opening portion through a groove portion formed between the first opening portion and the second opening portion such that the first opening portion is communicated with the second opening portion, and the groove portion of the substrate has a length which is in a range of from 10% to 50% of widths of the first and second opening portions.

19. The printed wiring board according to claim 1, wherein the electronic components are chip capacitors, and the plurality of via conductors connect the conductive layer to electrodes of the chip capacitors.

\* \* \* \* \*